(12) United States Patent
Rascuná

(10) Patent No.: US 12,302,624 B2
(45) Date of Patent: May 13, 2025

(54) WIDE BAND GAP SEMICONDUCTOR ELECTRONIC DEVICE HAVING A JUNCTION-BARRIER SCHOTTKY DIODE

(71) Applicant: STMICROELECTRONICS S.R.L., Agrate Brianza (IT)

(72) Inventor: Simone Rascuná, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 18/443,143

(22) Filed: Feb. 15, 2024

(65) Prior Publication Data

US 2024/0186424 A1    Jun. 6, 2024

Related U.S. Application Data

(62) Division of application No. 17/370,886, filed on Jul. 8, 2021, now Pat. No. 11,949,025.

(30) Foreign Application Priority Data

Jul. 15, 2020   (IT) .................. 102020000017221

(51) Int. Cl.
*H01L 29/872*   (2006.01)
*H01L 21/265*   (2006.01)
(Continued)

(52) U.S. Cl.
CPC ......... *H10D 8/60* (2025.01); *H01L 21/26513* (2013.01); *H10D 8/051* (2025.01); *H10D 8/411* (2025.01); *H10D 62/8325* (2025.01)

(58) Field of Classification Search
CPC ............. H01L 29/872; H01L 21/26513; H01L 29/1608; H01L 29/66143; H01L 29/8611;
(Continued)

(56) References Cited

U.S. PATENT DOCUMENTS

| | | | |
|---|---|---|---|
| 4,646,115 A | 2/1987 | Shannon et al. | |
| 6,562,706 B1 | 5/2003 | Liu et al. | |
| 7,851,881 B1 * | 12/2010 | Zhao | H01L 29/0619 |
| | | | 257/155 |

(Continued)

FOREIGN PATENT DOCUMENTS

| | | |
|---|---|---|
| CN | 104681637 A | 6/2015 |
| CN | 105206681 A | 12/2015 |
| CN | 216413089 U | 4/2022 |
| JP | 2000196107 A | 7/2000 |

OTHER PUBLICATIONS

Rupp et al., "A new SiC diode with significantly reduced threshold voltage," Proceedings of the 29th International Symposium on Power Semiconductor Devices & IC, 2017, pp. 355-358.

*Primary Examiner* — Khaja Ahmad
*Assistant Examiner* — Khatib A Rahman
(74) *Attorney, Agent, or Firm* — Seed IP Law Group LLP (57) ABSTRACT

The vertical-conduction electronic power device is formed by a body of wide band gap semiconductor which has a first conductivity type and has a surface, and is formed by a drift region and by a plurality of surface portions delimited by the surface. The electronic device is further formed by a plurality of first implanted regions having a second conductivity type, which extend into the drift region from the surface, and by a plurality of metal portions, which are arranged on the surface. Each metal portion is in Schottky contact with a respective surface portion of the plurality of surface portions so as to form a plurality of Schottky diodes formed by first Schottky diodes and second Schottky diodes, wherein the first Schottky diodes have, at equilibrium, a Schottky barrier having a height different from that of the second Schottky diodes.

20 Claims, 9 Drawing Sheets

(51) Int. Cl.
*H01L 29/16* (2006.01)
*H01L 29/66* (2006.01)
*H01L 29/861* (2006.01)
*H10D 8/00* (2025.01)
*H10D 8/01* (2025.01)
*H10D 8/60* (2025.01)
*H10D 62/832* (2025.01)

(58) Field of Classification Search
CPC ............. H01L 29/6606; H01L 29/2003; H01L 29/0619; H01L 29/36; H01L 29/66212; H01L 29/0603; H01L 29/0684
See application file for complete search history.

(56) References Cited

U.S. PATENT DOCUMENTS

| | | | |
|---|---|---|---|
| 10,818,749 B2* | 10/2020 | Mauder | H01L 29/7827 |
| 11,658,241 B2* | 5/2023 | Kim | H01L 27/088 |
| | | | 257/334 |
| 2008/0203517 A1* | 8/2008 | Rueb | H01L 29/6606 |
| | | | 257/E27.024 |
| 2011/0175106 A1* | 7/2011 | Mizukami | H01L 29/0692 |
| | | | 257/77 |
| 2014/0183562 A1 | 7/2014 | Kiyosawa et al. | |
| 2015/0144966 A1 | 5/2015 | Konrath et al. | |
| 2015/0372093 A1* | 12/2015 | Saggio | H01L 29/1608 |
| | | | 257/77 |
| 2020/0220007 A1* | 7/2020 | Lin | H01L 29/872 |

* cited by examiner

WIDE BAND GAP SEMICONDUCTOR ELECTRONIC DEVICE HAVING A JUNCTION-BARRIER SCHOTTKY DIODE

BACKGROUND

Technical Field

The present disclosure relates to a wide band gap semiconductor electronic device, comprising a JBS (Junction-Barrier Schottky) diode having improved electrical characteristics and to the corresponding manufacturing method. In particular, reference will be made hereinafter to a vertical-conduction electronic power device.

Description of the Related Art

As is known, semiconductor materials that have a wide band gap, for example greater than 1.1 eV, low ON-state resistance, high thermal conductivity, high operating frequency, and high rate of saturation of the charge carriers, such as silicon carbide (SIC) and gallium nitride (GaN), allows to obtain electronic devices, for example diodes and transistors, that have better performances than silicon electronic devices, in particular for power applications, for example operating at voltages comprised between 600 V and 1300 V or in specific operating conditions, such as high temperature.

In particular, it is known to obtain the above electronic devices from a wafer of silicon carbide in one of its polytypes, for example 3C-SiC, 4H-SiC and 6H-SiC, which are distinguished by the characteristics listed above.

Figure 1:
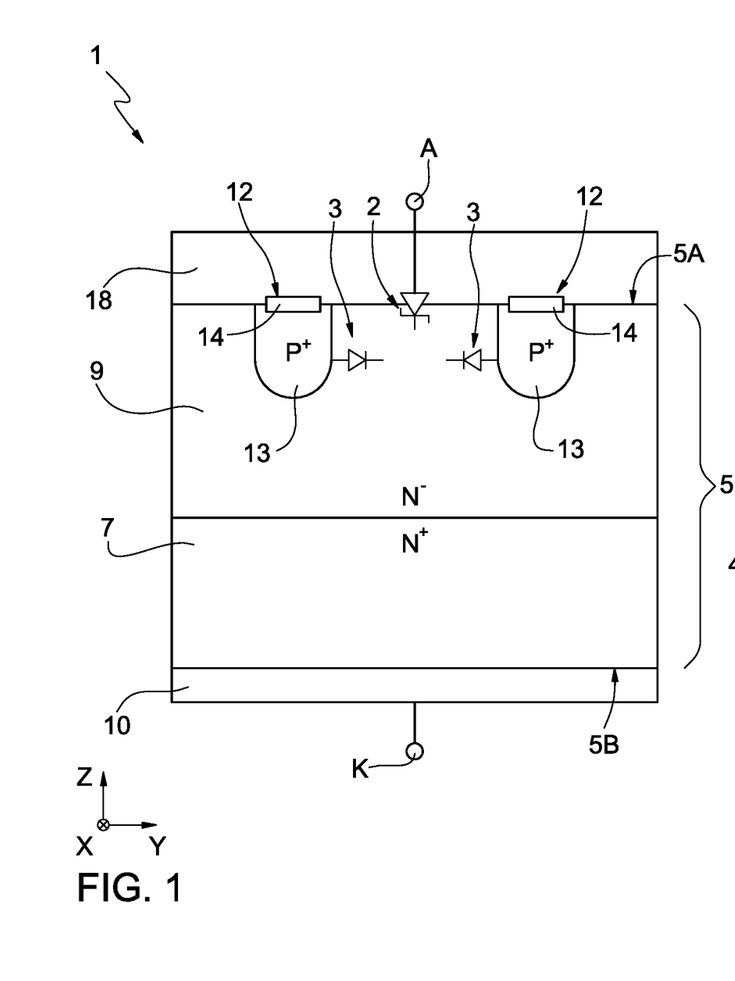
FIG. 1 is a cross-section of a known wide band gap electronic semiconductor power device.

For instance, FIG. 1 shows a known JBS diode 1, of silicon carbide. The JBS diode 1 is generally formed by a plurality of elementary cells (just one is shown), which are equal to one another and are arranged in parallel in a same die; each elementary cell comprises a Schottky diode 2 and a pair of PN diodes 3, connected together in parallel.

The JBS diode 1 is formed in a body 5 of silicon carbide (SiC), which is delimited by a first surface 5A and a second surface 5B opposite to one another along a first axis Z of a Cartesian reference system XYZ, and comprises a substrate 7 and a drift region 9 arranged on top of the substrate 7, for example epitaxially grown thereon.

The substrate 7 is of an N-type and forms the second surface 5B of the body 5.

The drift region 9 is of an N-type, with a doping level lower than the doping level of the substrate 7, and forms the first surface 5A of the body 5.

A cathode metallization region 10 of conductive material, for example nickel or nickel silicide, extends on the second surface 5B of the body 5 and forms a cathode K of the JBS diode 1.

The JBS diode 1 further comprises a plurality of barrier regions 12, two of which are visible in FIG. 1, substantially housed in the drift region 9.

The barrier regions 12 are arranged at a distance apart from each other along a second axis Y of the Cartesian reference system XYZ and are each formed by a respective implanted region 13 of a P-type, which extends from the first surface 5A of the body 5 into the drift region 9. Moreover, the barrier regions 12 extend along a third axis X of the Cartesian reference system XYZ.

The barrier regions 12 each further comprise a respective ohmic contact region 14, of conductive material, for example nickel silicide, which extends on a respective implanted region 13, partially inside it, and, in the cross-section of FIG. 1, has an extension along the second axis Y smaller than or equal to the extension of the respective implanted region 13.

The interfaces between the implanted regions 13 and the drift region 9 each form a PN diode 3.

The JBS diode 1 further comprises an anode metallization region 18, of metal material such as titanium, nickel, or molybdenum, which extends on the first surface 5A of the body 5, forming an anode A of the JBS diode 1.

Portions of the anode metallization region 18 in direct electrical contact with the drift region 9, alongside the implanted regions 13, form Schottky junctions (i.e., semiconductor-metal junctions), each constituting a respective Schottky diode 2.

The Schottky junctions each have a respective barrier having, at equilibrium, a height $\Phi_0$, which determines a conduction threshold voltage of the respective Schottky diode 2.

In use, a bias voltage may be applied between the cathode K and the anode A of the JBS diode 1 so as to obtain a forward or reverse bias.

In detail, in forward bias (anode A at a potential higher than the cathode K), a forward voltage is applied so as to lower the barrier height $\Phi_0$ of the Schottky junctions, in order to switch on the Schottky diodes 2 and allow the flow of an operating current, for example of 10 A, between the anode A and the cathode K of the JBS diode 1.

A low barrier height $\Phi_0$, and thus a low conduction threshold voltage of the Schottky diodes 2, enables to reduce the value of the forward voltage that is necessary for the flow of the operating current and thus to achieve a low power consumption of the JBS diode 1.

On the other hand, in reverse bias (i.e., with the cathode K at a potential higher than the anode A), the JBS diode 1 must guarantee a value of the leakage current between the anode A and the cathode K as low as possible in the presence of high bias voltages, comprised, for example, between 600 V and 1300 V.

Such high bias voltages generate high electrical fields in the Schottky junctions, causing an increase of the leakage current, for example because of the tunnel effect. Such an increase is particularly significant especially if the barrier height $\Phi_0$ is small.

Consequently, a small barrier height $\Phi_0$ causes a high leakage current and thus problems of operation of the JBS diode 1.

Moreover, in reverse bias, each PN diode 3 causes formation of a respective depleted zone, having a low concentration of charge carriers, which extends from the interface between the respective implanted region 13 and the drift region 9, mainly inside the drift region 9.

The depleted zone contributes to lower locally, in the proximity of a respective Schottky junction, the electrical field value generated by the high bias voltages.

It is thus known to design the JBS diode 1 so as to provide a distance along the second axis Y between two adjacent implanted regions 13 that is as small as possible. A smaller distance between two adjacent implanted regions 13 enables in fact a greater lowering of the electrical field of the entire Schottky junction and consequently a lowering of the leakage current.

However, a smaller distance between two adjacent implanted regions 13 entails a smaller area of the Schottky diode 2 available for the current flow in forward bias and thus a resistance increase of the JBS diode 1, with consequent worsening of the performance of the JBS diode 1.

BRIEF SUMMARY

According to the present disclosure, a wide band gap semiconductor electronic device comprising a JBS diode and a corresponding manufacturing method are provided.

One embodiment of the present disclosure is directed to a vertical-conduction electronic power device that includes a body of wide band gap semiconductor, having a first conductivity type and a surface. The body includes a drift region and a plurality of first metal anode regions on the surface. A second metal anode region is on the first metal anode region and on the surface. A plurality of first implanted regions of a second conductivity type are extending into the drift region from the surface. A plurality of first Schottky diodes, each having, at equilibrium, a first Schottky barrier height are at a plurality of first interfaces between the surface of the drift region and the plurality of first metal anode regions. A plurality of second Schottky diodes, each having, at equilibrium, a second Schottky barrier height that is different from the first Schottky barrier height, the plurality of second Schottky diodes are at a plurality of second interfaces between the surface of the drift region and the second metal anode region.

Another embodiment of the present disclosure is directed to a device that includes a drift region of a first conductivity type, the drift region having a surface, a first implanted region of a second conductivity type in the drift region, a first interface between the first implanted region and the drift region, a first metal anode on the first implanted region, a second metal anode on the first metal anode and on the surface, and a second interface between the second metal anode and the first metal anode, the second interface being spaced from the first interface along a first direction.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Described hereinafter is a wide band gap semiconductor JBS (Junction Barrier Schottky) diode, in particular of silicon carbide, which is incorporated in a vertical-conduction electronic power device and comprises a plurality of Schottky diodes of different types, wherein each type of Schottky diode has a Schottky junction that has, at equilibrium, a different barrier height.

Figure 2A:
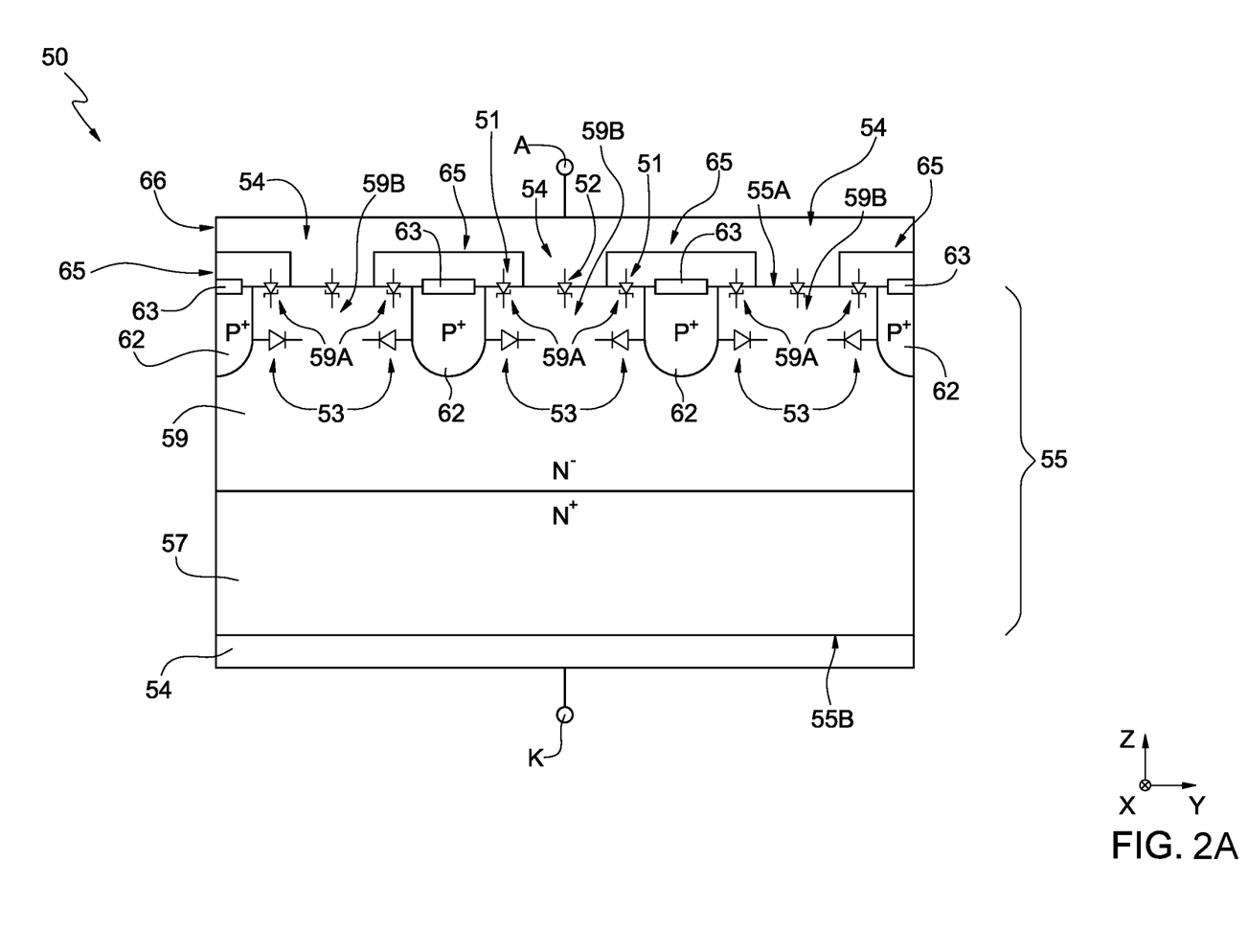
FIG. 2A is a cross-section of an embodiment of the present wide band gap electronic semiconductor power device wherein electrical equivalents are highlighted.
Figure 2B:
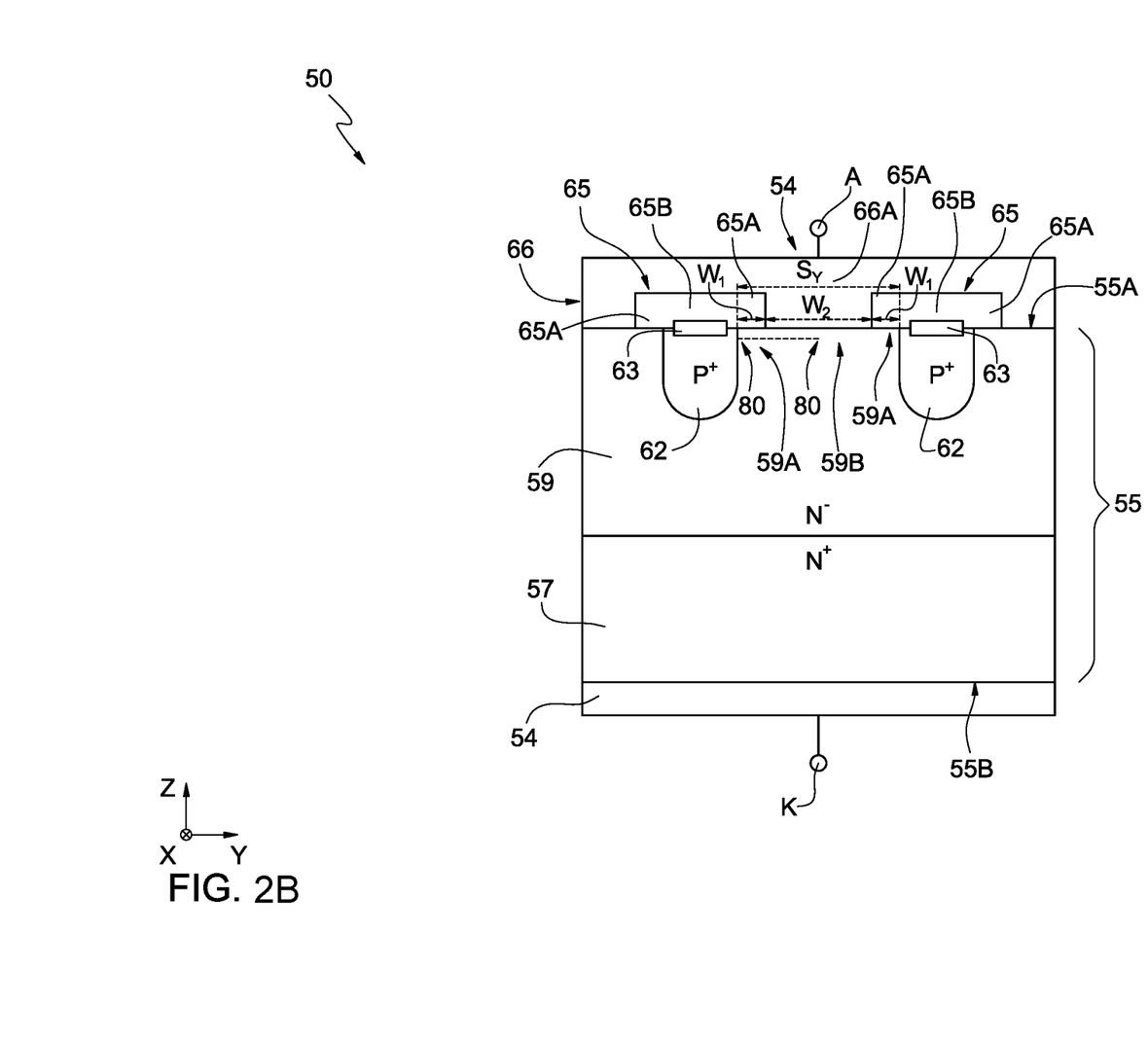
FIG. 2B shows an enlarged detail of FIG. 2A, wherein geometrical parameters of the present electronic device are highlighted.

In detail, FIGS. 2A and 2B show a JBS diode 50, which comprises, in this embodiment, a plurality of elementary cells 54 that are equal to one another, connected in parallel in a same die.

As shown in particular in FIG. 2A, each elementary cell 54 comprises one or more first-type Schottky diodes 51, one or more second-type Schottky diodes 52, and one or more PN diodes 53 arranged in parallel. In particular, in this embodiment, each elementary cell 54 is formed by two first-type Schottky diodes 51 and by one second-type Schottky diode 52, arranged between two adjacent PN diodes 53.

The JBS diode 50 is formed in a body 55 of silicon carbide (SIC), which is delimited by a first surface 55A and a second surface 55B opposite to one another along a first axis Z of a Cartesian reference system XYZ and comprises a substrate 57 and a drift region 59 arranged on top of the substrate 57, for example epitaxially grown thereon.

The substrate 57 is of an N-type, with doping level such as to have low resistivity, for example comprised between 2 mΩ·cm and 30 mΩ·cm, has a thickness comprised, for example, between 50 μm and 360 μm, in particular 180 μm, and forms the second surface 55B of the body 55.

The drift region 59 is of an N-type, with a doping level lower than the doping level of the substrate 57, for example of the order of 1016 at/cm³, has a thickness comprised between 5 μm and 15 μm, and forms the first surface 55A of the body 55.

The thickness of the drift region 59 may be chosen at the design stage based on the specific application of the JBS diode 50, for example according to a maximum operating voltage to be applied to the JBS diode 50.

A cathode metallization region 54 of conductive material, for example nickel or nickel silicide, extends on the second surface 55B of the body 55 and forms a cathode K of the JBS diode 50.

The JBS diode 50 further comprises a plurality of implanted regions 62 housed in the drift region 59.

The implanted regions 62 are of a P-type, have a doping level higher than the doping level of the drift region 59, each extend from the first surface 55A of the body 55 inside the drift region 59 for a depth, along the first axis Z, smaller than the depth of the drift region 59, and each have a width, along a second axis Y of the Cartesian reference system XYZ, comprised, for example, between 1 μm and 6 μm.

Moreover, the implanted regions 62 are arranged at a distance $S_Y$ apart from each other along the second axis Y, for example comprised between 2 μm and 5 μm.

In top view (not illustrated herein), the implanted regions 62 may have the shape of strips, which extend longitudinally along a third axis X of the Cartesian reference system XYZ, or may have any other shape; for example, they may form regular or irregular geometrical figures, such as squares, rectangles, hexagons, or circles. Consequently, the implanted regions 62 illustrated in FIG. 2A may be portions of a single region having a more complex shape, visible as separate regions in the illustrated cross-section.

The interfaces between the implanted regions 62 and the drift region 59 form PN junctions, each forming a respective PN diode 53.

The JBS diode 50 may further comprise a plurality of ohmic contact regions 63 of conductive material, each extending over a respective implanted region 62 and having a shape approximately corresponding to that of the implanted regions 62. Each ohmic-contact region 63 is in direct electrical contact with a respective implanted region 62 and extends, along the second axis Y, for a width smaller than or equal to the width of the respective implanted region 62.

In detail, in this embodiment, the ohmic-contact regions 63 are of nickel silicide, each extending partially within a respective implanted region 62, and having a width smaller than that of the respective implanted regions 62.

The JBS diode 50 further comprises a plurality of anode metallization regions, one for each type of Schottky diode (as described in detail hereinafter), which extend on the first surface 55A of the body 55. In this embodiment, the JBS diode 50 comprises first anode metallization regions 65 and a second anode metallization region 66.

The first anode metallization regions 65 also have a shape approximately corresponding to that of the respective implanted regions 62, but have a greater width, as described in detail hereinafter; moreover, as explained above for the implanted regions 62, they may constitute portions of a first single anode metallization region 65 having a more complex shape. They are in any case electrically connected in parallel, so that they may be considered as a single region.

The first anode metallization regions 65 are of a first metal material, for example molybdenum, and each comprise at least one first portion 65A (FIG. 2B), which extends on, and is in direct electrical contact with, a respective first portion 59A of the drift region 59, in a position contiguous to the respective implanted region 62, on a side thereof. In this embodiment, the first anode metallization regions 65 each further comprise a respective second portion 65B, which extends on, and is in direct electrical contact with, a respective implanted region 62 and a respective ohmic-contact region 63.

The first portions 65A of the first anode metallization region 65 each have a width $W_1$ and are arranged at a distance $W_2$ from a first portion 65A of an adjacent first anode metallization region 65.

The first portions 65A of the first anode metallization region 65 each form, with the respective first portion 59A of the drift region 59, a Schottky junction constituting a respective first-type Schottky diode 51 (FIG. 2). The junctions of the first-type Schottky diodes 51 each have a respective Schottky barrier having, at equilibrium, a height $\Phi_1$, for example of approximately 0.9 eV, which determines a first conduction threshold voltage of the respective first-type Schottky diode 51.

The second anode metallization region 66 is of a second metal material, for example titanium or nickel, and extends on the first surface 55A of the body 55 and on the first anode metallization regions 65. Consequently (FIG. 2B), portions 66A of the second metallization region 66 are in direct electrical contact (Schottky contact) with second portions 59B of the drift region 59 for a width equal to the distance $W_2$ between two first portions 65A of adjacent first anode metallization regions 65.

In other words, the second portions 59B are arranged at a greater distance, with respect to the first portions 59A, from a respective same implanted region 62.

The portions 66A of the second metallization region 66 thus form, with the second portions 59B of the drift region 59, Schottky junctions constituting respective second-type Schottky diodes 52 (FIG. 2A). The junctions of the second-type Schottky diodes 52 each have a respective Schottky barrier having, at equilibrium, a height $\Phi_2$ greater than the barrier height $\Phi_1$, for example of 1.2 eV, which determines a second conduction threshold voltage of the respective second-type Schottky diode 52 higher than the first conduction threshold voltage.

The first and the second anode metallization regions 65, 66 further form an anode A of the JBS diode 50.

In use, in forward bias (voltage applied to the anode A higher than the voltage applied to the cathode K of the JBS diode 50), a low voltage enables the flow of a high operating current, for example of the value of 10 A, from the anode A to the cathode K of the JBS diode 50.

In fact, the first-type Schottky diodes 51 enable a current flow in view of lower forward voltages compared to the second-type Schottky diodes 52 since the first conduction threshold voltage is lower than the second conduction threshold voltage.

Figure 3:
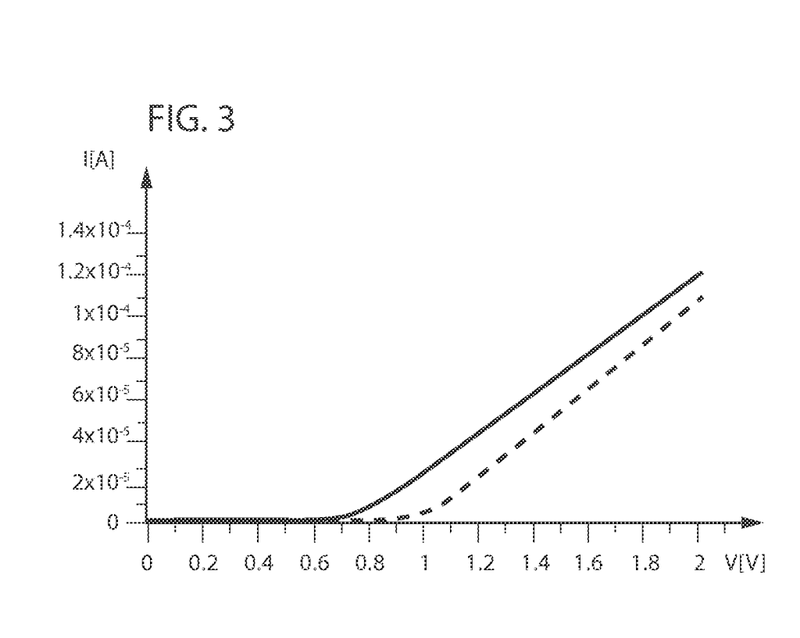
FIG. 3 shows a simulation of the forward bias current-voltage curve of an elementary cell of the electronic device of FIG. 2A compared with an elementary cell of the known electronic device of FIG. 1.

Consequently, as a whole, the JBS diode 50 has a conduction threshold lower than the JBS diode 1 illustrated in FIG. 1, as represented in the simulation illustrated in FIG. 3 performed by the Applicant, wherein the solid-line curve represents the plot of the current I as a function of the voltage V for the JBS diode 50 and the dashed line shows the same plot for the known JBS diode 1, with reference to an elementary cell. As may be noted, with the JBS diode 50 it is possible to obtain the flow of a same current in view of a lower forward bias voltage applied between the anode A and the cathode K.

Consequently, the JBS diode 50 has a low power consumption in forward bias.

In reverse bias, high voltages between the anode A and the cathode K, for example comprised between 600 V and 1300 V, may be applied to the JBS diode 50.

In reverse bias, the interfaces between the implanted regions 62 and the drift region 59 each form a respective depleted region, having a low concentration of charge carriers, which locally lowers the electrical field generated by the high voltages, in particular in the proximity of the first surface 55A of the body 55.

In fact, in this embodiment, the depleted regions extend mainly in the drift region 59 since this has a doping level lower than that of the implanted regions 62.

In particular, the first portions 59A of the drift region 59 each extend at a smaller distance from a respective PN junction compared to the second portions 59B of the drift region 59.

Thus, the first portions 59A are more affected by the influence of the respective depleted zone. Consequently, the first portions 59A are subject locally, in the proximity of the first surface 55A of the body 55, to an average electrical field lower than the average electrical field of the second portions 59B of the drift region 59.

In other words, the electrical field in the drift region 59, in the proximity of the first surface 55A of the body 55, has a minimum value at the interface between the first portions 59A of the drift region 59 and the implanted regions 62, and increases moving away from the implanted regions 62 along the second axis Y, until it has a maximum value at the center of the second portions 59B of the drift region 59, i.e., at a maximum distance from the implanted regions 62.

Figure 4:
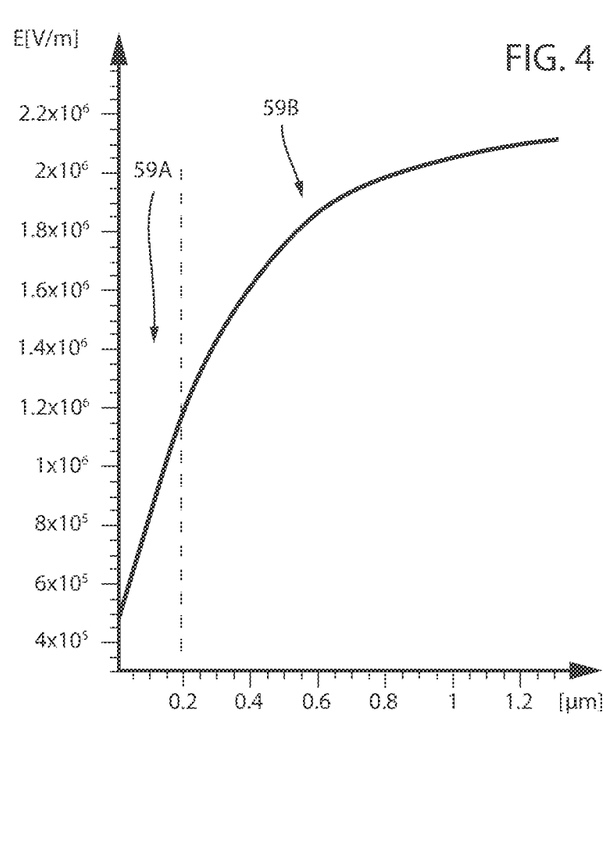
FIG. 4 shows a graph of the behavior of the electrical field along section line 80 of FIG. 2B.

The above electrical behavior is illustrated in the simulation of FIG. 4 performed by the Applicant, which shows the behavior of the electrical field E along the line 80 of FIG. 2B, which extends in a direction parallel to the first surface 55A from the interface between an implanted region 62 and a first portion 59A of the drift region 59 to a central point of the second portion 59B of the drift region 59.

The first-type Schottky diodes 51 extend in the first portions 59A of the drift region 59 and are thus subject to a low average electrical field.

The first-type Schottky diodes 51 may thus guarantee a low leakage current in view of the high voltages applied in reverse bias.

The second-type Schottky diodes 52 extend at the second portions 59B of the drift region 59 and are thus subject to a higher average electrical field.

However, the second-type Schottky diodes 52 have a barrier height $\Phi_2$ greater than the barrier height $\Phi_1$ and may thus guarantee low leakage currents even in the presence of a higher electrical field.

It follows that, as a whole, the JBS diode 50 is able to obtain low leakage currents in reverse bias.

At the design stage, by maintaining the distance $S_Y$ between two adjacent implanted regions 62 constant, the width $W_1$ and the distance $W_2$ may be tuned based on the characteristics of the JBS diode 50 required by a specific application. For instance, if it is preferable to obtain a low forward bias voltage, the width $W_1$ may be increased and the distance $W_2$ may be reduced. On the other hand, if it is preferable to obtain a low leakage current in reverse bias, the width $W_1$ may be reduced and the distance $W_2$ may be increased.

In addition, the JBS diode 50 may be designed so that the distance $S_Y$ between two adjacent implanted regions 62 is large, for example up to the point where the depleted regions of two adjacent PN diodes 53 are in a condition of little overlap.

The fact that two adjacent depleted regions 62 are in a condition of little overlap causes a higher average electrical field in the second portions 59B of the drift region 59, compared to a case wherein the distance $S_Y$ is smaller. However, the greater barrier height of the second-type Schottky diodes 52 enables to compensate such greater average electrical field and thus to guarantee a low leakage current. Furthermore, a greater distance $S_Y$ enables the JBS diode 50 to have a lower resistance to the current flow between the anode and the cathode, and thus a low power consumption, in forward bias.

When the distance $S_Y$ is large, in fact, the area of the first-type Schottky diodes 51 and of the second-type Schottky diodes 52 available for the current flow, which depends, respectively, also on the width $W_1$ and the distance $W_2$, is bigger than for a smaller distance $S_Y$. Consequently, as a whole, the JBS diode 50 may have a bigger area available for the passage of current and thus a lower resistance in forward bias.

In other words, the JBS diode 50 is able to provide both a low power consumption in forward bias and a low leakage current in reverse bias.

Figure 5:
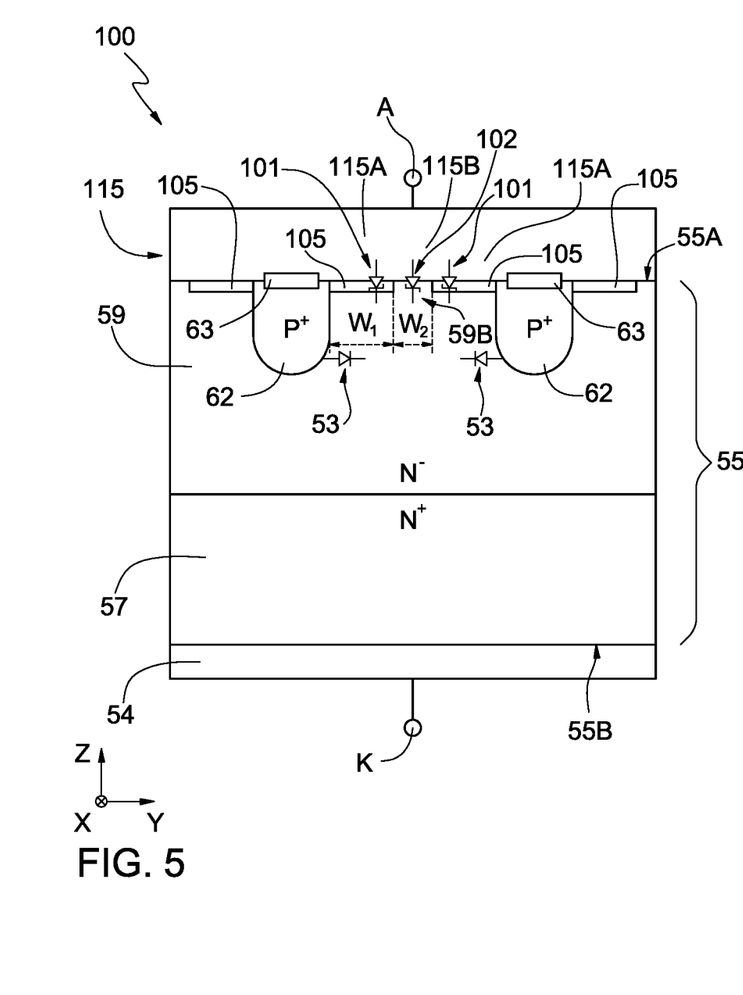
FIG. 5 shows a cross-section of the present wide band gap electronic semiconductor power device according to another embodiment.

FIG. 5 shows a JBS diode 100 according to another embodiment.

The JBS diode 100 has a structure similar to the JBS diode 50, and thus the elements in common are designated by the same reference numbers.

In detail, the JBS diode 100 comprises first-type Schottky diodes 101 and second-type Schottky diodes 102, as well as the PN diodes 53, and is formed in the body 55. The body 55 also here comprises the substrate 57, the drift region 59, the implanted regions 62, and the ohmic-contact regions 63. In addition, the cathode metallization region 54 extends on the second surface 55B of the body 55.

The JBS diode 100 further comprises a plurality of implanted anode regions 105, of an N-type, which extend from the first surface 55A of the body 55 into the drift region 59, alongside each implanted region 62. The implanted anode regions 105 have a doping level higher than the doping level of the drift region 59; for example, they have a concentration of dopant atoms higher than $1 \cdot 10^{17}$ at/cm$^3$ and a small depth, for example comprised between 10 nm and 100 nm.

In detail, the implanted anode regions 105 each extend in the drift region 59, contiguous to a respective implanted region 62, each have a width $W_1$, and are arranged at the distance $W_2$ from a respective adjacent implanted anode region 105, as explained previously with reference to the JBS diode 50 for the first portions 65A of the first anode metallization regions 65.

Thus, the implanted anode regions 105 constitute surface portions of the drift region 59 similar to the first portions 59A of the JBS diode 50 and have a higher doping level than first portions 59A.

An anode metallization region 115, for example of molybdenum, titanium, or nickel extends on the first surface 55A of the body 55 and on the ohmic-contact regions 63.

First portions 115A of the anode metallization region 115 in direct electrical contact (Schottky contact) with the implanted anode regions 105 each form a respective first-type Schottky diode 101; each first-type Schottky diode 101 has, at equilibrium, a Schottky barrier having a height $\Phi_1$.

Second portions 115B of the anode metallization region 115 in direct electrical contact with the second portions 59B of the drift region 59, having a width equal to the distance $W_2$ between two adjacent implanted anode regions 105, each form a respective second-type Schottky diode 102; each second-type Schottky diode 102 has, at equilibrium, a Schottky barrier having a height $\Phi_2$ greater than that of the first-type Schottky diodes 101.

In this embodiment, the difference of barrier height between the Schottky diodes 101 and the second-type Schottky diodes 102 depends upon the difference between the doping level of the implanted anode regions 105 and the doping level of the drift region 59. This difference may be regulated, at the design stage, according to the specific applications.

As explained previously with reference to the JBS diode 50, the Schottky junctions of the first-type Schottky diodes 101 have a smaller barrier height and are subject to lower electrical fields as compared to the Schottky junctions of the second-type Schottky diodes 102.

Thus, as a whole, the JBS diode 100 has a low power consumption, a low leakage current, and a high adaptability to different operating conditions.

Figure 6:
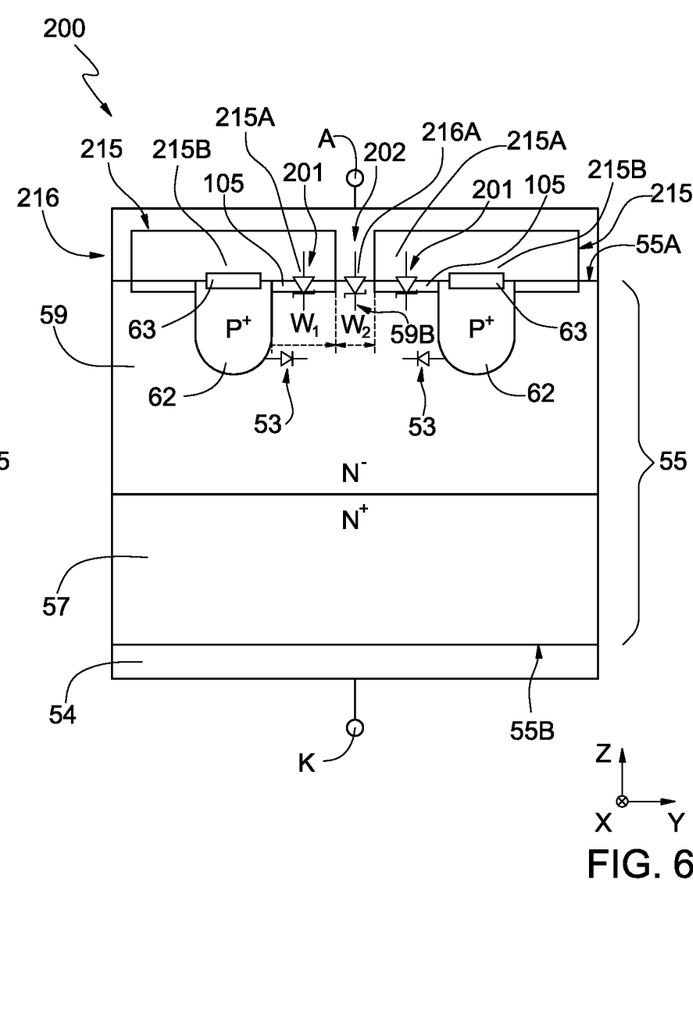
FIG. 6 shows a cross-section of the present wide band gap electronic semiconductor power device according to a further embodiment.

FIG. 6 shows a further embodiment of the present JBS diode, herein referred to as JBS diode 200.

The JBS diode 200 has a general structure similar to the JBS diodes 50, 100, so that elements in common are designated by the same reference numbers.

In detail, the JBS diode 200 comprises first-type Schottky diodes 201 and second-type Schottky diodes 202, as well as the PN diodes 53, and is formed in the body 55 comprising the substrate 57. The substrate also here comprises the drift region 59, the implanted regions 62, the ohmic-contact regions 63, and the implanted anode regions 105. Furthermore, the cathode metallization region 54 extends on the second surface 55B of the body 55.

Moreover, the JBS diode 200 comprises first anode metallization regions 215 and a second anode metallization region 216, which extend on the first surface 55A of the body 55.

The first anode metallization regions 215 have a shape similar to that of the first anode metallization regions 65 described with reference to the JBS diode 50 of FIG. 2 and are also of the first metal material, for example molybdenum.

In particular, the first anode metallization regions 215 each comprise a plurality of portions that include at least one first portion 215A having a width $W_1$, and are arranged on top of, and in direct electrical contact (Schottky contact) with, a respective implanted anode region 105. In this embodiment, each first anode metallization region 215 also comprises a second portion 215B, which extends on a respective implanted region 62 and a respective ohmic-contact region 63 and is in direct electrical contact therewith.

The first portions 215A of the first anode metallization regions 215 in Schottky contact with the respective implanted anode regions 105 form the first-type Schottky diodes 201, which each have a Schottky junction having, at equilibrium, a Schottky barrier of height $\Phi_1$.

The second anode metallization region 216 is of the second metal material, for example titanium or nickel, and extends on the first surface 55A of the body 55 and on the first anode metallization regions 215.

Consequently, portions 216A of the second anode metallization region 216 are in direct electrical contact (Schottky contact) with the second portions 59B of the drift region 59 arranged between two adjacent implanted anode regions 105, which thus have a width equal to the distance $W_2$. The portions 216A of the second anode metallization region 216 form, with the second portions 59B of the drift region 59, the second-type Schottky diodes 202, which each have a Schottky junction having, at equilibrium, a barrier of a height $\Phi_2$ greater than the barrier having a height $\Phi_1$ of the first-type Schottky diodes 201.

In this embodiment, the barrier height of the first-type Schottky diodes 201 and of the second-type Schottky diodes 202 may be regulated both by modifying the difference between the doping level of the implanted anode regions 105 and of the drift region 59 and by modifying the difference of barrier height induced by the first metal material and the second metal material, which form, respectively, the first anode metallization regions 215 and the second anode metallization region 216.

The JBS diode 200 thus has similar advantages to the ones explained previously as regards the JBS diodes 50, 100, and has a greater adaptability to different operating conditions, which may be regulated at the design stage.

Figure 7:
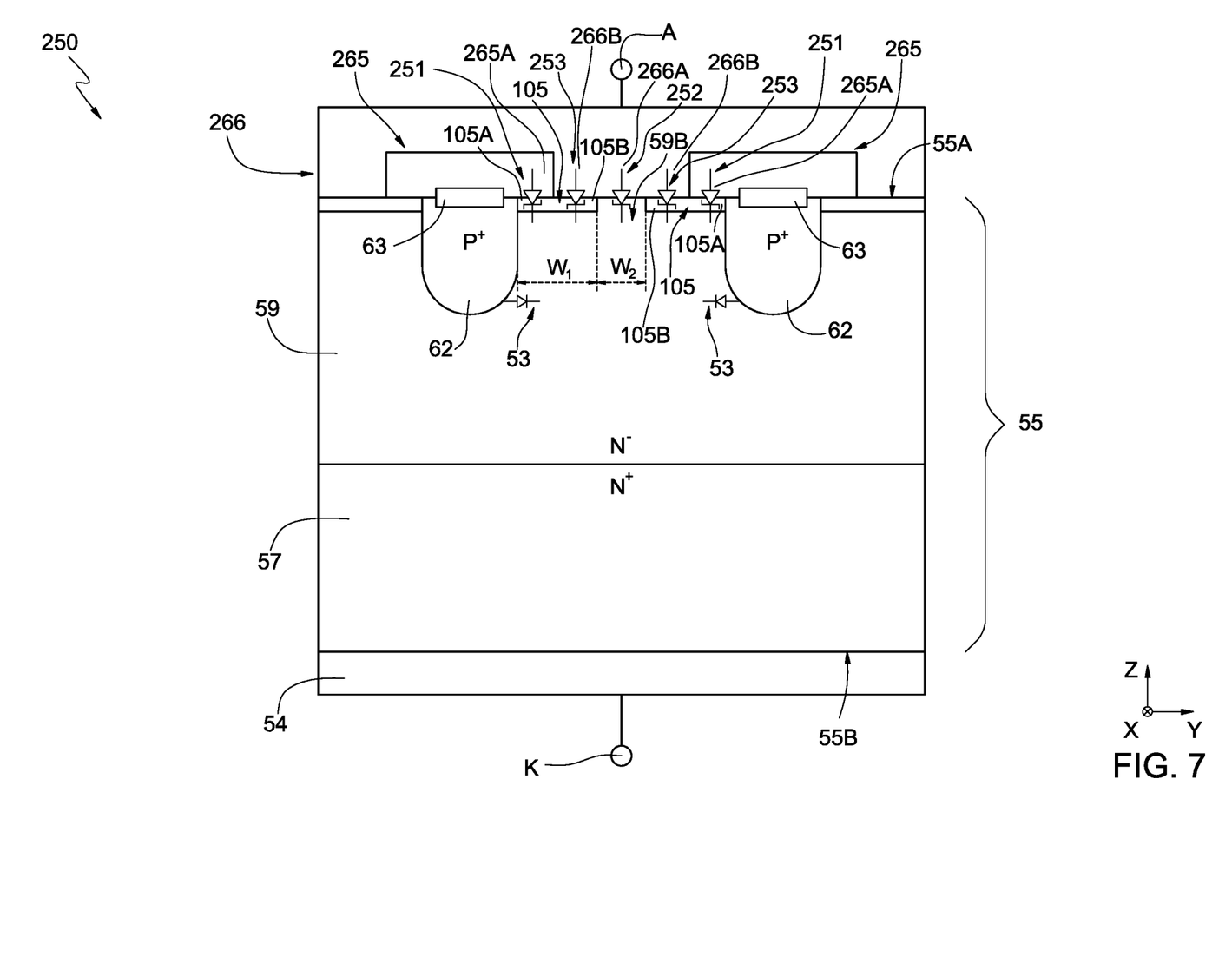
FIG. 7 shows a cross-section of the present wide band gap electronic semiconductor power device according to a further embodiment.

FIG. 7 shows a further embodiment of the present JBS diode, herein referred to as JBS diode 250. The JBS diode 250 has a structure similar to that of the JBS diode 200, and thus elements in common are designated by the same reference numbers.

The JBS diode 250 comprises first-type Schottky diodes 251, second-type Schottky diodes 252, and third-type Schottky diodes 253, arranged in parallel with the PN diodes 53.

In detail, in this embodiment, portions 265A of first anode metallization regions 265 (similar to the first portions 215A of the first anode metallization regions 215 of the JBS diode 200) each extend on a first portion 105A of a respective implanted anode region 105 contiguous to a respective implanted region 62, for a width smaller than the width $W_1$ of the implanted anode regions 105.

A second anode metallization region 266 (which is similar to the second anode metallization region 216 of the JBS diode 200), extends on the first surface 55A of the body 55.

In detail, first portions 266A of the second anode metallization region 266 are in direct electrical contact (Schottky contact) with the second portions 59B of the drift region 59, and second portions 266B of the second anode metallization region 266 are in direct electrical contact (Schottky contact) with second portions 105B of the implanted anode regions 105 contiguous to the first portions 105A.

The second portions 105B of the implanted anode regions 105 are thus each arranged between a respective first portion 105A of the implanted anode regions 105 and a respective second portion 59B of the drift region 59.

In addition, the second portions 105B of the implanted anode regions 105 each are at a greater distance than a respective first portion 105A from a same respective implanted region 62, and at a smaller distance than a respective second portion 59B from the same respective implanted region 62.

In other words, the first portions 265A of the first anode metallization regions 265 in direct electrical contact with the first portions 105A of the implanted anode regions 105 form Schottky junctions that have a barrier, at equilibrium, of a height $\Phi_1$ and form the first-type Schottky diodes 251.

The first portions 266A of the second anode metallization region 266 in direct electrical contact with the second portions 59B of the drift region 59 form Schottky junctions that have a barrier, at equilibrium, of a height $\Phi_2$ greater than the height $\Phi_1$, and that form the second-type Schottky diodes 252.

The second portions 266B of the second anode metallization region 266 in direct electrical contact with the second portions 105B of the implanted anode regions 105 form Schottky junctions that have a barrier, at equilibrium, of a height $\Phi_3$ greater than the height $\Phi_1$ and smaller than the height $\Phi_2$, and that form the third-type Schottky diodes 253.

The third-type Schottky diodes 253 thus have a conduction threshold voltage lower than that of the second-type Schottky diodes 252. Thus, as a whole, the JBS diode 250 has a low conduction threshold and a consequent low power consumption.

Furthermore, the third-type Schottky diodes 253 are arranged at the second portions 105B of the implanted anode regions 105, which, being arranged at a distance from an adjacent implanted region 62 that is smaller than the distance of the second portions 59B from the same adjacent implanted region 62, are subject, in reverse bias, to a lower average electrical field than are the second portions 59B of the drift region 59.

Consequently, as a whole, the first-type Schottky diodes 251, the second-type Schottky diodes 252, and the third-type Schottky diodes 253 may also guarantee low leakage currents for the JBS diode 250.

Described hereinafter are the steps for manufacturing the JBS diodes 50, 100, 200, 250.

Figure 8:
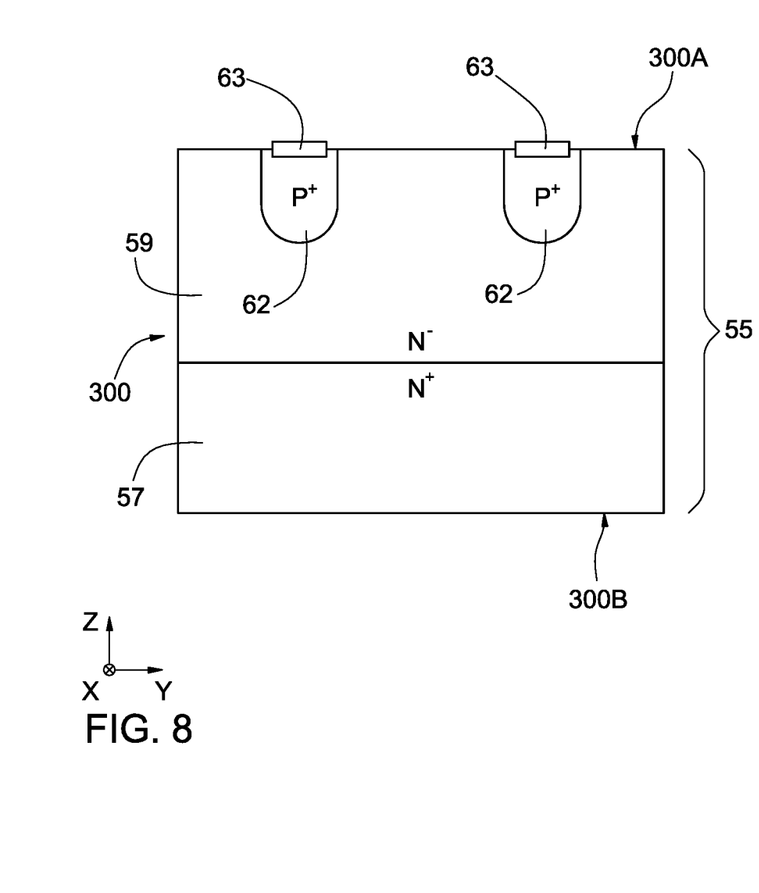
FIGS. 8-11 show cross-sections of the electronic power device of FIG. 2A in successive manufacturing steps.

The JBS diode 50 may be manufactured from a wafer 300 of silicon carbide (SiC), illustrated in cross-section in FIG. 8, having a first surface 300A and a second surface 300B, and already subjected to first known processing steps.

In particular, in FIG. 8, the wafer 300 has already been processed so as to form the body 55 (the first and the second surfaces 55A, 55B of which correspond, respectively, to the first surface 300A and to the second surface 300B of the wafer 300) comprising the substrate 57, the drift region 59, the implanted regions 62, and the ohmic-contact regions 63.

Figure 9:
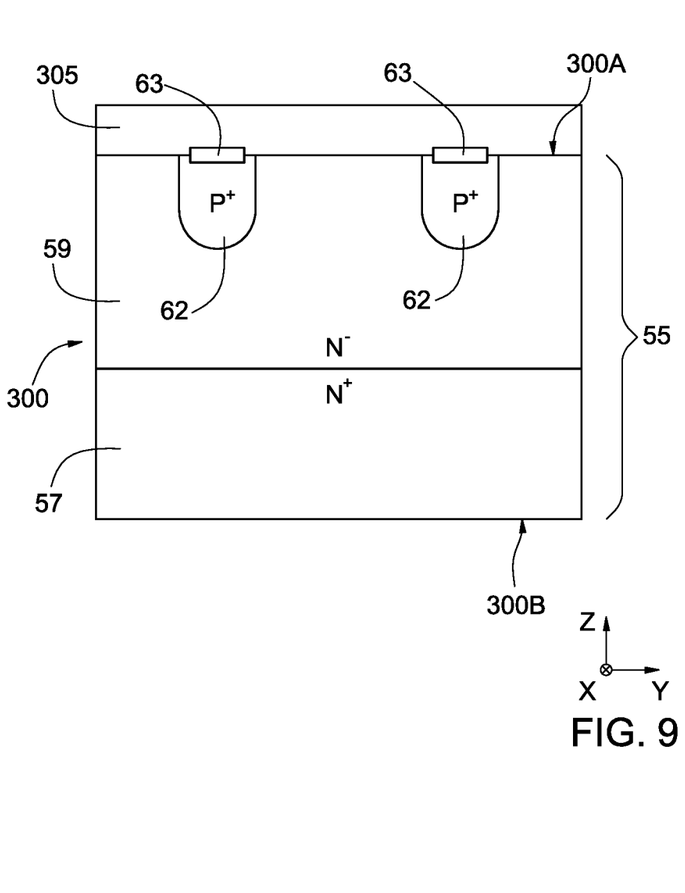
Figure 10:
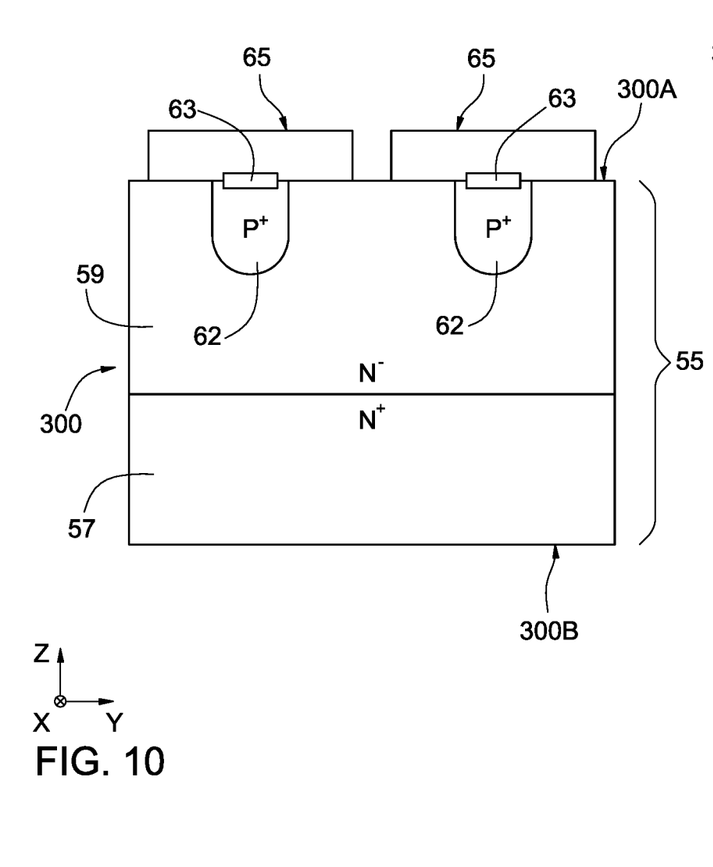

Next, FIG. 9, a first metallization layer 305 of the first metal material, for example molybdenum, is deposited on the first surface 300A of the wafer 300 and patterned (FIG. 10), via known lithographic steps so as to form the first anode metallization regions 65.

Figure 11:
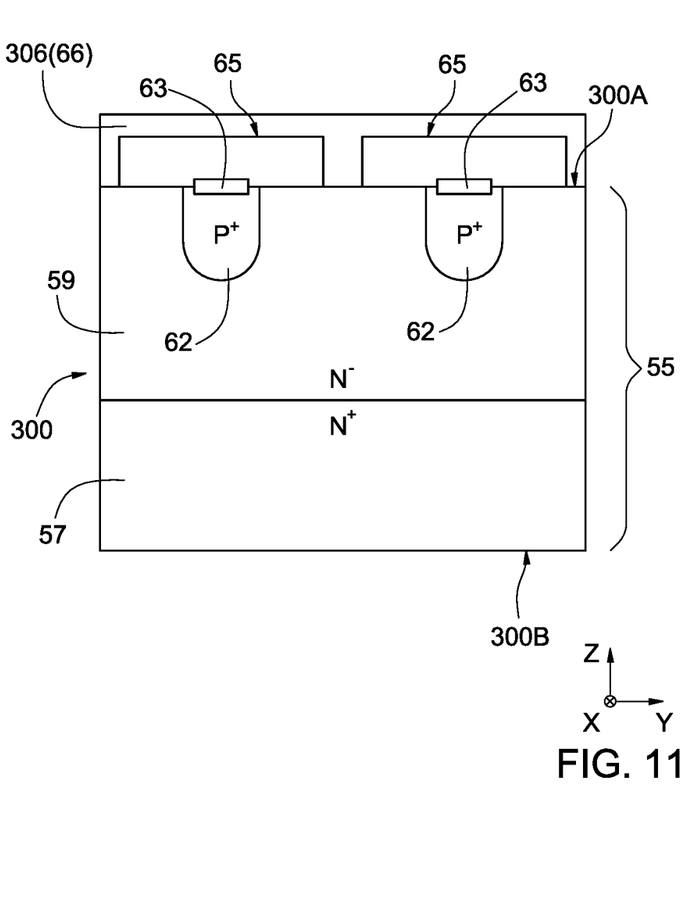

Next, FIG. 11, a second metallization layer 306, of the second metal material, for example titanium or nickel, is deposited on the first surface 300A of the wafer 300 so as to form the second anode metallization region 66.

Known processing steps follow, such as thinning the substrate 57, forming the cathode metallization region on the second surface 300B of the wafer 300, dicing the wafer 300, and packaging, to obtain the JBS diode 50.

Figure 12:
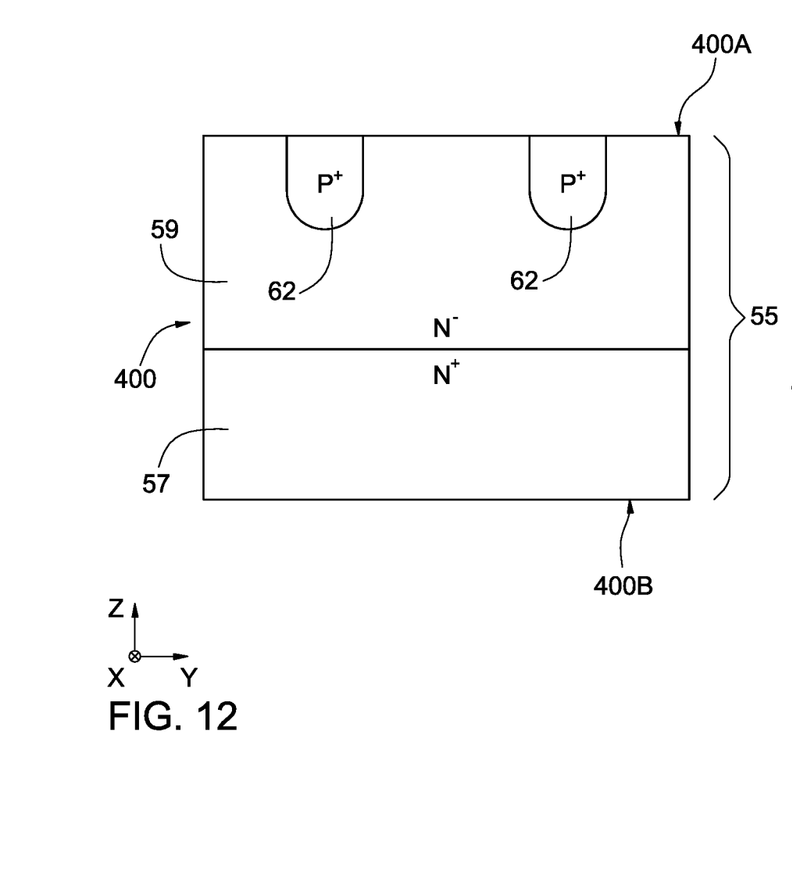
FIGS. 12-14 show cross-sections of the electronic device of FIG. 5 in successive manufacturing steps.

The JBS diode 100 may be manufactured from a wafer 400 of silicon carbide illustrated in FIG. 12. The wafer 400 is similar to the wafer 300 illustrated in FIG. 8; consequently, similar elements are designated by the same reference numbers.

In detail, the wafer 400, having a first surface 400A and a second surface 400B, has already been processed so as to form the substrate 57, the drift region 59, and the implanted regions 62.

Figure 13:
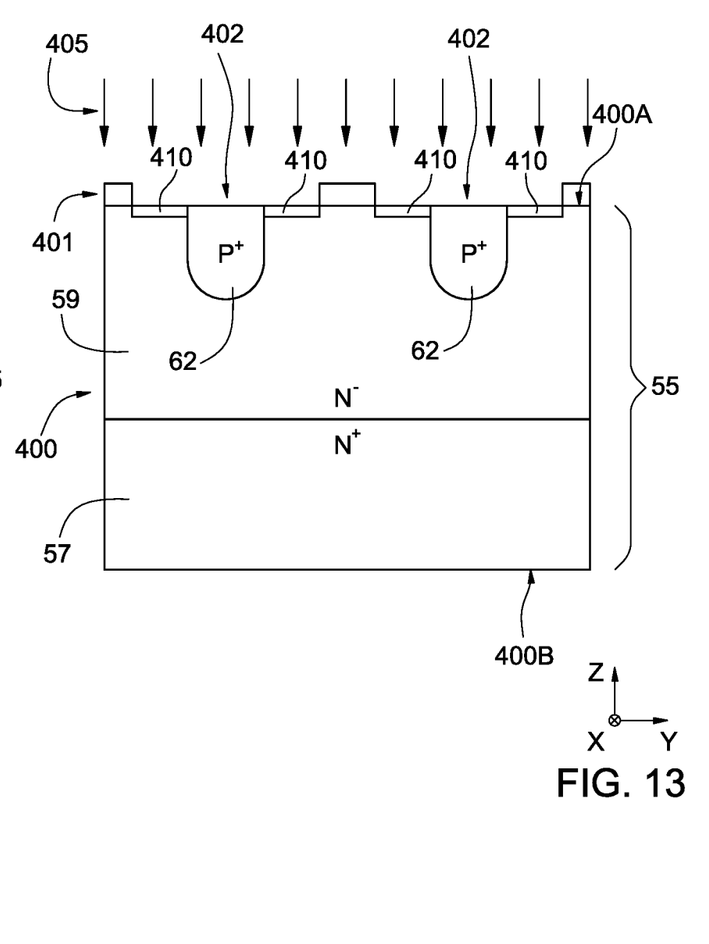

Next, FIG. 13, a hard mask 401, comprising a plurality of windows 402, is provided on the first surface 400A of the wafer 400. The windows 402 are arranged above the implanted regions 62 and above portions of the drift region contiguous to the respective implanted regions 62, where the implanted anode regions 105 are intended to be formed.

The windows 402 are used for implanting ions, as schematically represented by the arrows 405, and forming doped regions 410, here of an N-type, which are intended to form the implanted anode regions 105.

The ions may be implanted with a dose comprised, for example, between $10^{11}$ and $10^{13}$ at/cm$^2$, in particular 1012 at/cm$^2$. This dose is in fact sufficient to increase the doping level of the respective portions of the drift region 59, without jeopardizing the doping of the implanted regions 62.

Alternatively, the hard mask 401 may comprise portions (not illustrated) that extend also on the implanted regions 62 so that the windows 402 are arranged only above the portions of the drift region 59 where the implanted anode regions 105 are intended to be formed.

Figure 14:
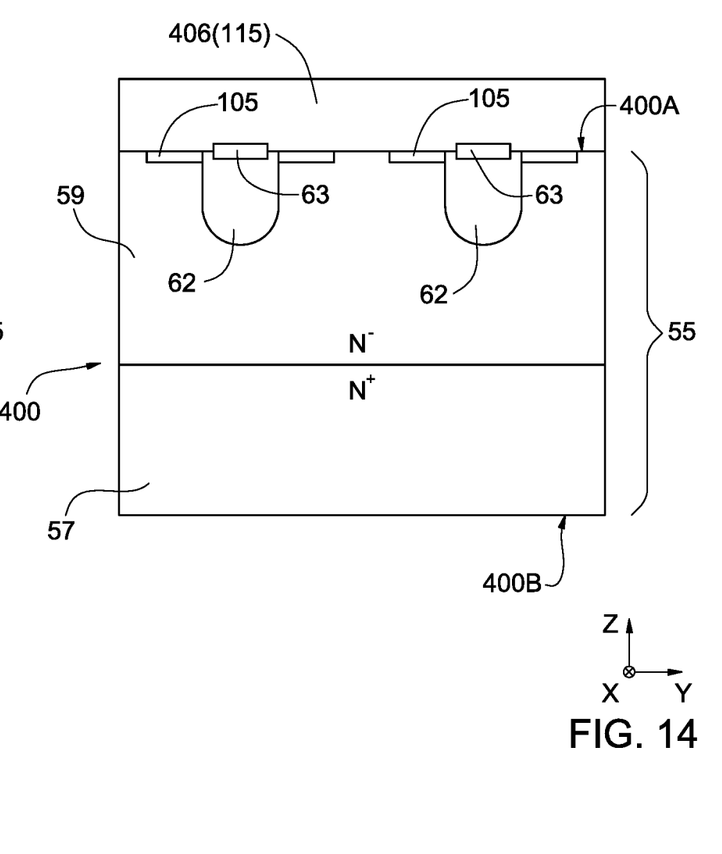

In a way not illustrated but known, the hard mask 401 is then removed, and the wafer 400 is subjected to annealing for activation of the doped regions 410, for example at a temperature higher than 1500° ° C., so as to form the implanted anode regions 105 (FIG. 14).

Subsequently, FIG. 14, the ohmic-contact regions 63 are formed in a known way, and a first metallization layer 406, of the second metal material, for example titanium or nickel, is deposited on the first surface 400A of the wafer 400 so as to form the second anode metallization region 115.

Known processing steps follow, such as thinning the substrate 57, forming the cathode metallization region on the second surface 400B of the wafer 400, dicing the wafer 400, and packaging, to obtain the JBS diode 100.

It will be clear to the person skilled in the art that the JBS diodes 200, 250 may be obtained, from the wafer 400 of FIG. 12, through steps similar to the ones already described with reference to FIGS. 9-14 regarding the JBS diodes 50, 100, and thus are not illustrated any further.

Finally, it is clear that modifications and variations may be made to the wide band gap semiconductor electronic device and to the corresponding manufacturing method described and illustrated herein, without thereby departing from the scope of the present disclosure, as defined in the annexed claims.

For instance, the conductivity types, P and N, may be reversed, and what described above may also be applied to an MPS ("Merged PiN Schottky") diode.

A vertical-conduction electronic power device (50; 100; 200; 250) may be summarized as including
   a body (55) of wide band gap semiconductor, having a first conductivity type and a surface (55A), the body including a drift region (59) and a plurality of surface portions (59A, 59B; 105, 105A, 105B) delimited by the surface;
   a plurality of first implanted regions (62) of a second conductivity type, extending into the drift region from the surface;
   a plurality of metal portions (65A, 66A; 115A, 115B; 215A, 216A; 265A, 266A, 266B) arranged on the surface (55A), each metal portion being in Schottky contact with a respective surface portion of the plurality of surface portions so as to form a plurality of Schottky diodes (51, 52; 101, 102; 201, 202; 251, 252, 253), including first Schottky diodes and second Schottky diodes,
   wherein the first Schottky diodes have, at equilibrium, a Schottky barrier having a height different from the second Schottky diodes.

The first Schottky diodes (51; 101; 201; 251) may include first metal portions (65A; 115A; 215A; 265A) of the plurality of metal portions and first surface portions of the plurality of surface portions (59A; 105; 105A), the first metal portions being in Schottky contact with the first surface portions and forming, at equilibrium, a Schottky barrier having a first height ($\Phi_1$); wherein the second Schottky diodes (52; 102; 202; 252) may include second metal portions (66A; 115B; 216A; 266A) of the plurality of metal portions and second surface portions (59B) of the plurality of surface portions, the second metal portions being in Schottky contact with the second surface portions and forming, at equilibrium, a Schottky barrier of a second height ($\Phi_2$), the first height being smaller than the second height.

The first surface portions (59A; 105; 105A) may be each arranged at a first distance from a respective first implanted region (62); the second surface portions (59B) may be each arranged at a second distance from the same respective first implanted region, the first distance being smaller than the second distance.

The first metal portions (65A; 115A; 215A; 265A) may be of a first metal material, and the second metal portions (66A; 115B; 216A; 266A) may be of a second metal material;
   the drift region and the first and the second surface portions may have the first conductivity type; and
   the first metal material may be different from the second metal material and/or the first and the second surface portions may have a different doping level.

The drift region and the first and the second surface portions may have the same doping level, and the first metal material may be different from the second metal material.

The first surface portions may have a first doping level, and the second surface portions may have a second doping level lower than the first doping level, and the first metal material may be different from the second metal material.

Each first surface portion may be contiguous to a respective first implanted region and may be arranged between the respective first implanted region and a respective second surface portion, the electronic device may further include a plurality of first metal regions (65; 215) and a second metal region (66; 216), each first metal region including an ohmic-contact portion (65B; 215B) overlying a respective first implanted region and a Schottky-contact portion (65A; 215A) forming a respective first metal portion in contact with a respective first surface portion (59A), and the second metal region extending on the first metal regions and forming the second metal portions in contact with the second surface portions (59B).

The electronic device may further include third Schottky diodes (253) including third metal portions (266B) of the plurality of metal portions and third surface portions (105B) of the plurality of surface portions, the third metal portions being in Schottky contact with the third surface portions (105B) and forming, at equilibrium, a Schottky barrier having a third height ($\Phi_3$); the third surface portions having the first doping level and each being arranged between a respective first surface portion (105A) and a respective second surface portion (59B), and the third height ($\Phi_3$) being greater than the first height ($\Phi_1$) and smaller than the second height ($\Phi_2$).

Each first surface portion may be contiguous to a respective first implanted region, the electronic device may further include a plurality of first metal regions (265) and a second metal region (266), each first metal region comprising an ohmic-contact portion (265B) overlying a respective first implanted region and a Schottky-contact portion (265A) forming a respective first metal portion in contact with a respective first surface portion, and the second metal region extending on the first metal regions and forming the second metal portions (266A) in contact with the second surface portions (59B) and the third metal portions (266B) in contact with the third surface portions (105B).

The first surface portions (105) may have a first doping level and the second surface portions (59B) may have a second doping level lower than the first doping level and the first metal material may be the same as the second metal material.

Each first surface portion may be contiguous to a respective first implanted region (62) and may be arranged between the respective first implanted region and a respective second surface portion; the first surface portions may be formed by second implanted regions (105); and the first and the second metal portions (115A, 115B) may form a single metal region (115) extending on and in direct electrical contact with the second implanted regions and the second surface portions.

The electronic device may further include a plurality of conductive regions (63), the conductive regions each being in ohmic contact with a respective implanted region (62) and with a respective metal portion.

A method for manufacturing a vertical-conduction electronic power device from a wafer (300; 400) of wide band gap semiconductor having a first conductivity type and a surface (300A; 400A), the wafer including a drift region (59) and a plurality of first implanted regions (62), the plurality of first implanted regions having a second conductivity type and extending in the drift region from the surface may be summarized as including forming a plurality of metal portions (65A, 66A; 115A, 115B; 215A, 216A; 265A, 266A, 266B) on the surface, each metal portion being in Schottky contact with the drift region at a plurality of surface portions (59A, 59B; 105) of the drift region, each surface portion being delimited by the surface, so as to form a plurality of Schottky diodes (51, 52; 101, 102; 201, 202; 251, 252, 253) including first Schottky diodes and second Schottky diodes,
wherein the first Schottky diodes have, at equilibrium, a Schottky barrier having a height different from the second Schottky diodes.

Forming a plurality of metal portions may include depositing a layer (406) of metal material, and the method may further include the step of:
introducing dopant species of the first conductivity type at the surface portions.

Forming a plurality of metal portions may include
depositing a first layer (305) of a first metal material;
patterning the first layer so as to form first metal portions (65A; 115A; 215A; 265A) in Schottky contact with first surface portions (59A; 105; 105A) of the plurality of surface portions; and
depositing a second layer (306) of a second metal material.

The drift region may have the first conductivity type and a first doping level, and the method may further include
selectively implanting ions of the first conductivity type in the drift region in surface areas surrounding the implanted regions (62), so as to form doped regions (410) each having a second doping level higher than the first doping level.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a vertical-conduction electronic power device from a wafer of wide band gap semiconductor having a first conductivity type and a surface, the wafer including a drift region and a plurality of first implanted regions, the plurality of first implanted regions having a second conductivity type and extending in the drift region from the surface, the forming including:
forming a plurality of first and second Schottky diodes by forming a plurality of metal portions on the surface, each of the plurality of metal portions being in Schottky contact with the drift region at a plurality of surface portions of the drift region, the first Schottky diodes have, at equilibrium, a Schottky barrier having a height different from the second Schottky diodes, the forming of the plurality of metal portions including:
forming each of the plurality of metal portions on a respective one of the plurality of first implanted regions, each of the plurality of first implanted regions having an interface with the drift region, each of the plurality of metal portions having edges that are spaced from the interface of each of the plurality of first implanted regions with the drift region, each of the plurality of metal portions being in contact with a respective one of the plurality of first implanted regions and with the drift region.

2. The method according to claim 1, further comprising introducing dopant species of the first conductivity type at the plurality of surface portions.

3. The method according to claim 1, wherein forming the plurality of metal portions comprises:
depositing a first layer of a first metal material;
patterning the first layer so as to form first metal portions in Schottky contact with first surface portions of the plurality of surface portions; and
depositing a second layer of a second metal material.

4. The method according to claim 1, wherein the drift region has the first conductivity type and a first doping level, the method further comprising:
forming doped regions each having a second doping level higher than the first doping level by selectively implanting ions of the first conductivity type in the drift region in surface areas surrounding the plurality of first implanted regions.

5. A method, comprising:
forming a vertical-conduction electronic power device by:
forming a drift region of a first conductivity type;
forming a plurality of first implanted regions having a second conductivity type in the drift region;
forming a plurality of first and second Schottky diodes by forming a plurality of metal portions in contact with the drift region, the first Schottky diodes having, at equilibrium, a Schottky barrier having a height different from the second Schottky diodes; and
forming each of the plurality of metal portions on a respective one of the plurality of first implanted regions, each of the plurality of first implanted regions having an interface with the drift region.

6. The method of claim 5 wherein each of the plurality of metal portions has edges that are spaced from the interface of each of the plurality of first implanted regions with the drift region, each of the plurality of metal portions being in contact with a respective one of the plurality of first implanted regions and with a surface of the drift region.

7. The method of claim 5 comprising forming a plurality of ohmic contacts, each positioned in a respective one of the plurality of first implanted regions.

8. The method of claim 7 comprising forming a plurality of first metal anode regions and forming a second metal anode region on the plurality of first metal anode regions.

9. A method, comprising:
forming a vertical-conduction electronic power device by:
forming a drift region in a body of wide band gap semiconductor, having a first conductivity type and a surface;
forming a plurality of first metal anode regions on the surface;
forming a plurality of first implanted regions of a second conductivity type, in the drift region;
forming a plurality of first Schottky diodes, each having, at equilibrium, a first Schottky barrier height at a plurality of first interfaces between the drift region and the plurality of first metal anode regions; and
forming a plurality of ohmic contacts, each positioned in a respective one of the plurality of first implanted regions.

10. The method of claim 9 comprising forming a second metal anode region on the plurality of first metal anode regions and on the surface.

11. The method of claim 10 comprising forming a plurality of second Schottky diodes, each having, at equilibrium, a second Schottky barrier height that is different from the first Schottky barrier height, the plurality of second Schottky diodes being at a plurality of second interfaces between the drift region and the second metal anode region.

12. The method of claim 11 wherein the first Schottky barrier height is smaller than the second Schottky barrier height.

13. The method of claim 11 comprising forming a first one of the plurality of first Schottky diodes at a first distance from a first one of the plurality of first implanted regions, forming a first one of the plurality of second Schottky diodes at a second distance from the first one of the first implanted regions, the first distance being smaller than the second distance.

14. The method of claim 11 wherein the plurality of first metal anode regions are a different material than the second metal anode region.

15. The method of claim 14 the first conductivity type is different from the second conductivity type.

16. The method of claim 15 wherein each one of the plurality of first metal anode regions is on a respective one of the plurality of ohmic contacts.

17. The method of claim 16 comprising forming a plurality of third Schottky diodes between adjacent ones of the plurality of first Schottky diodes.

18. The method of claim 17 wherein each of the plurality of third Schottky diodes has, at equilibrium, a third Schottky barrier height, the third Schottky barrier height being greater than the first Schottky barrier height and smaller than the second Schottky barrier height.

19. A method, comprising:
forming a vertical-conduction electronic power device by:
forming a drift region of a first conductivity type;
forming a plurality of first implanted regions having a second conductivity type in the drift region;
forming a plurality of first and second Schottky diodes by forming a plurality of metal portions in contact with the drift region, the first Schottky diodes having, at equilibrium, a Schottky barrier having a height different from the second Schottky diodes; and
forming a plurality of ohmic contacts, each positioned in a respective one of the plurality of first implanted regions.

20. The method of claim 19 comprising forming a plurality of first metal anode regions and forming a second metal anode region on the plurality of first metal anode regions.

* * * * *